(12) United States Patent
Cheng et al.

(10) Patent No.: US 10,497,795 B2
(45) Date of Patent: Dec. 3, 2019

(54) TRIPLE WELL ISOLATED DIODE AND METHOD OF MAKING

(71) Applicant: TAIWAN SEMICONDUCTOR MANUFACTURING COMPANY, LTD., Hsinchu (TW)

(72) Inventors: Chih-Chang Cheng, Hsinchu (TW); Fu-Yu Chu, Hsinchu (TW); Ruey-Hsin Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 55 days.

(21) Appl. No.: 15/200,727

(22) Filed: Jul. 1, 2016

(65) Prior Publication Data

US 2016/0315170 A1    Oct. 27, 2016

Related U.S. Application Data

(62) Division of application No. 13/438,600, filed on Apr. 3, 2012, now Pat. No. 9,391,159.

(51) Int. Cl.
| | |
|---|---|
| H01L 29/66 | (2006.01) |
| H01L 29/861 | (2006.01) |
| H01L 29/06 | (2006.01) |
| H01L 23/535 | (2006.01) |
| H01L 29/735 | (2006.01) |
| H02M 3/156 | (2006.01) |
| H01L 21/768 | (2006.01) |

(52) U.S. Cl.
CPC .... *H01L 29/6625* (2013.01); *H01L 21/76895* (2013.01); *H01L 23/535* (2013.01); *H01L 29/0607* (2013.01); *H01L 29/0653* (2013.01); *H01L 29/66136* (2013.01); *H01L 29/735* (2013.01); *H01L 29/861* (2013.01); *H02M 3/156* (2013.01)

(58) Field of Classification Search
CPC ......... H01L 29/66121; H01L 29/66136; H01L 29/8611–8613
See application file for complete search history.

(56) References Cited

U.S. PATENT DOCUMENTS

| | | | |
|---|---|---|---|
| 7,420,255 B2 * | 9/2008 | Shimizu | H01L 27/0255 257/328 |
| 2004/0155257 A1 | 8/2004 | Yashita | |
| 2005/0104155 A1 * | 5/2005 | Jensen | H01L 27/0255 257/487 |

(Continued)

*Primary Examiner* — Kevin Parendo
(74) *Attorney, Agent, or Firm* — Hauptman Ham, LLP (57) ABSTRACT

A triple well isolated diode including a substrate having a first conductivity type and a buried layer in the substrate. The buried layer has a second conductivity type opposite to the first conductivity type. The triple well isolated diode includes an epi-layer over the substrate and the buried layer. A portion of the epi-layer having the first conductivity type contacts the buried layer. The triple well isolated diode includes a first well, a second well, a third well and a deep well in the epi-layer. The first well and the third well have the second conductivity type. The second well and the deep well have the first conductivity type. The second well surrounds sides of the first well. The third well surrounds sides of the second well. The deep well extends beneath the first well to electrically connect to the second well on opposite sides of the first well.

20 Claims, 4 Drawing Sheets (56) References Cited

U.S. PATENT DOCUMENTS

| | | |
|---|---|---|
| 2009/0121310 A1 | 5/2009 | Yamauchi |
| 2009/0294865 A1* | 12/2009 | Tang .................. H01L 27/0629 257/369 |
| 2009/0303762 A1 | 12/2009 | Jang et al. |
| 2011/0018067 A1* | 1/2011 | Usujima ........... H01L 21/82341 257/369 |

* cited by examiner

TRIPLE WELL ISOLATED DIODE AND METHOD OF MAKING

PRIORITY CLAIM

The present application is a divisional of U.S. application Ser. No. 13/438,600, filed Apr. 3, 2012, which is incorporated herein by reference in its entirety.

BACKGROUND

A boost converter circuit is intended to receive a low magnitude input voltage and transmit a higher magnitude output voltage. Because the boost converter circuit operates at high voltages, the components of the boost converter circuit are sufficiently robust to operate at high voltages. One component of a conventional boost converter circuit is a twin well diode. The twin well diode design is used to provide a higher breakdown voltage than a single well diode. The breakdown voltage is the voltage at which an element is damaged and no longer provides sufficient resistance to prevent current from passing through the element while the element is in an off state.

However, the design of the twin well diode forms a parasitic bipolar junction transistor (BJT) within the twin well diode. The parasitic BJT is formed between an epitaxially grown layer (epi-layer) having a first type of conductivity, a second well having a second type of conductivity and a first well having the first type of conductivity. For example, in a twin well diode having a p-type epi-layer and an n-type second well surrounding a p-type first well, the parasitic BJT is a P-N-P BJT. The parasitic BJT causes current leakage into the substrate which is electrically connected to a ground. In some instances, the current leakage is approximately 50%. The high current leakage significantly reduces the efficiency of the boost converter circuit, which limits the ability of the boost converter circuit to supply the desired power output.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
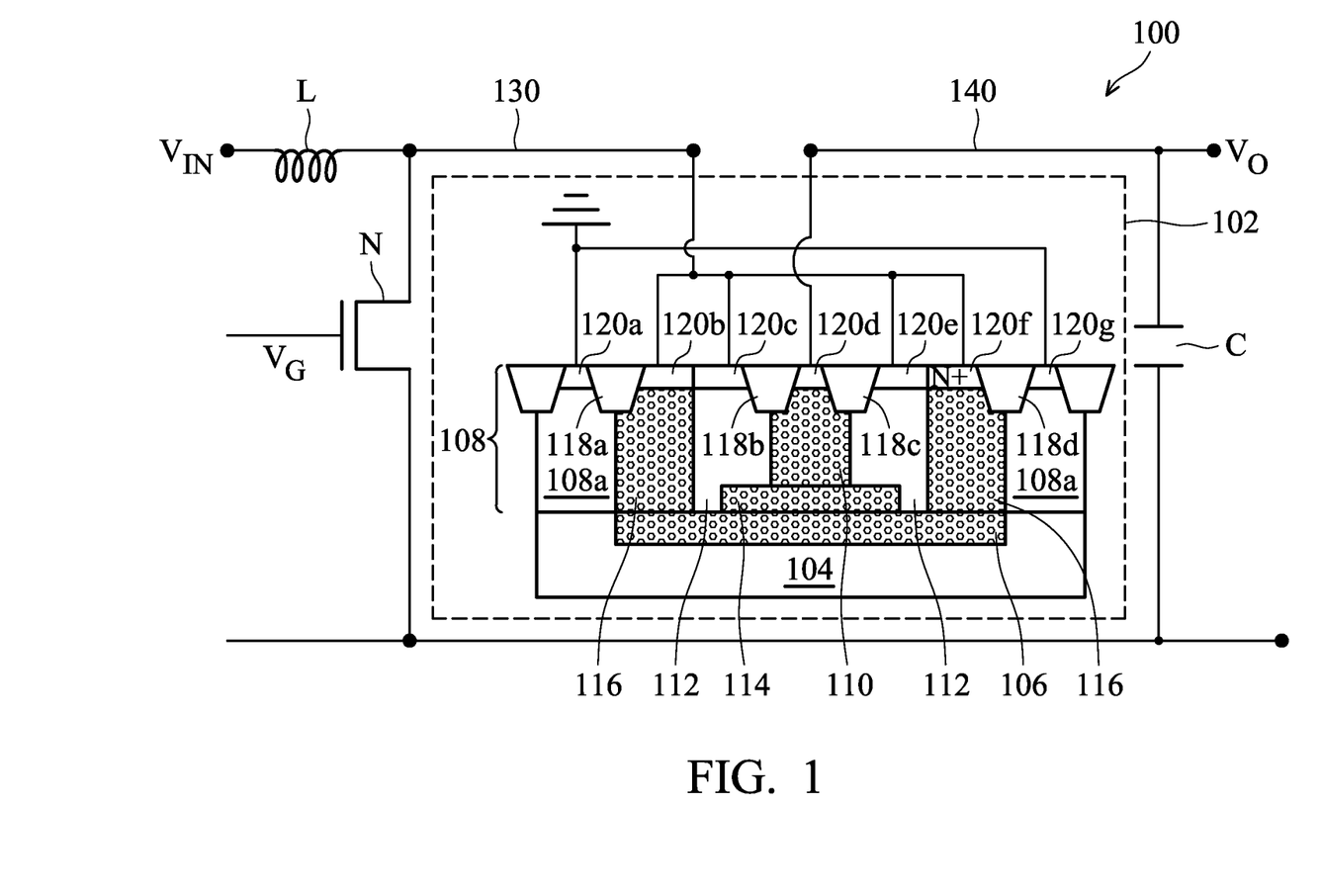
FIG. 1 is a side view diagram of a boost converter circuit having a triple well isolated diode according to one or more embodiments.

FIG. 1 is a side view diagram of a boost converter circuit 100 having a triple well isolated diode 102. Triple well isolated diode 102 includes a substrate 104 having a first type of conductivity and a buried layer 106 having a second conductivity type formed in substrate 104. The second conductivity type is opposite to the first conductivity type, i.e., if the first conductivity type is p-type, the second conductivity type is n-type and if the first conductivity type is n-type, the second conductivity type is p-type. Triple well isolated diode 102 further includes an epitaxially grown layer (epi-layer) 108 over a surface of substrate 104. Epi-layer 108 has the first conductivity type. A first well 110 having the second conductivity type is formed in epi-layer 108. A second well 112 having the first conductivity type is formed in epi-layer 108 surrounding sides of first well 110. A deep well 114 having the first conductivity type is formed in epi-layer 108, and extends beneath first well 110 and electrically connects opposite sides of second well 112. A third well 116 having the second conductivity type is formed in epi-layer 108 surrounding sides of second well 112 and electrically connecting to buried layer 106.

Triple well isolated diode 102 further includes isolation features 118a-118d. Isolation feature 118a is formed in a surface of epi-layer 108 opposite substrate 104 between an outer portion 108a of epi-layer 108 surrounding sides of third well 116 and an upper portion of third well 116. Isolation feature 118b is formed in a surface of epi-layer 108 opposite substrate 104 between an upper portion of second well 112 and first well 110. Isolation feature 118c is formed in a surface of epi-layer 108 opposite substrate 104 between the upper portion of second well 112 and first well 110 on an opposite side of first well 110 from isolation feature 118b. Isolation feature 118d is formed in a surface of epi-layer 108 opposite substrate 104 between outer portion 108a of epi-layer 108 and the upper portion of third well 116 on an opposite side of third well 116 from isolation feature 118a. No isolation feature is formed between second well 112 and third well 116. In some embodiments, isolation features 118a-118d are shallow trench isolation (STI) features. In some embodiments, isolation features 118a-118d comprise local oxidation of silicon (LOCOS). In some embodiments, a depth of isolation features 118a-118d ranges from 0.2 μm to 0.5 μm.

Triple well isolated diode 102 further includes contact regions 120a-120g over epi-layer 108 and in electrical connection with first well 110, second well 112, third well 116 and outer portion 108a of epi-layer 108. Contact region 120a is formed over the first outer portion 108a of epi-layer 108 and has the first conductivity type. Contact region 120b is formed over the first portion of third well 116 and has the second conductivity type. Contact region 120c is formed over the first portion of second well 112 and has the first conductivity type. Contact region 120d is formed over first well 110 and has the second conductivity type. Contact region 120e is formed over the second portion of second well 112 and has the first conductivity type. Contact region 120f is formed over the second portion of third well 116 and has the second conductivity type. Contact region 120g is formed over the second outer portion 108b of epi-layer 108 and has the first conductivity type.

In addition to triple well isolated diode 102, boost converter circuit 100 includes an input voltage source Vin electrically connected to an inductor L. An output of inductor L is electrically connected to an anode 130. Anode 130 is electrically connected to contact regions 120*b*, 120*c*, 120*e* and 120*f*. Anode 130 is also electrically connected to one side of a transistor N. An opposite side of transistor N is electrically connected to a first side of a capacitor C. A gate of transistor N is electrically connected to a gate signal voltage source $V_G$. A second side of capacitor C is electrically connected to a cathode 140. Cathode 140 is electrically connected to contact region 120*d* and is configured to provide an output voltage Vo to external elements. Contact regions 120*a* and 120*g* are electrically connected to a low voltage, i.e., a ground.

In some embodiments, substrate 104 is a semiconductor substrate. In some embodiments, substrate 104 comprises silicon, germanium, gallium nitride, or other suitable materials. In some embodiments, substrate 104 is lightly doped with either p-type or n-type dopants. When the conductivity type is p-type, suitable dopants include boron, aluminum, or other suitable p-type dopants. When the conductivity type is n-type, suitable dopants include phosphorous, arsenic, or other suitable n-type dopants. In some embodiments, the concentration of dopants in substrate 104 ranges from $10^{13}$ atoms/cm$^3$ to $10^{16}$ atoms/cm$^3$.

Buried layer 106 is formed by doping a portion of substrate 104 to have a conductivity type opposite substrate 104. Suitable dopants for buried layer 106 include dopants suitable for doping substrate 104 which have the opposite conductivity type. In some embodiments, the concentration of dopant in buried layer 106 ranges from $10^{18}$ atoms/cm$^3$ to $10^{20}$ atoms/cm$^3$. In some embodiments, buried layer is formed to a depth of 2 µm to 10 µm below a surface of substrate 104.

Epi-layer 108 is formed over buried layer 106 and substrate 104 and has the first conductivity type. Suitable dopants for epi-layer 108 include dopants suitable for doping substrate 104 which have the same conductivity type. In some embodiments, epi-layer 108 comprises a same material as substrate 104. In some embodiments, a dopant concentration in epi-layer 108 is higher than the dopant concentration in substrate 104. As the dopant concentration in epi-layer 108 increases a breakdown voltage of the device decreases. In some embodiments, epi-layer 108 is formed to a thickness ranging from 2 µm to 10 µm. In some embodiments, epi-layer 108 has a resistivity ranging from 5 ohm-cm to 200 ohm-cm. In some embodiments, epi-layer 108 has a dopant concentration ranging from $10^{13}$ atoms/cm$^3$ to $10^{16}$ atoms/cm$^3$.

First well 110 is formed in epi-layer 108 and has the second conductivity type. Suitable dopants for first well 10 includes dopants suitable for doping substrate 104 which have the opposite conductivity type. In some embodiments, a dopant concentration of first well 110 ranges from $10^{16}$ atoms/cm$^3$ to $10^{18}$ atoms/cm$^3$. In some embodiments, first well 110 has the same dopant concentration as buried layer 106. In some embodiments, first well 110 has a different dopant concentration from buried layer 106.

Second well 112 is formed in epi-layer 108 and has the first conductivity type. Suitable dopants for second well 112 include dopants suitable for doping substrate 104 which have the same conductivity type. Second well 112 surrounds the sides of first well 110. Portions of second well 112 below isolation features 118*b* and 118*c* are in electrical contact with first well 110. In some embodiments, a dopant concentration of second well 112 ranges from $10^{16}$ atoms/cm$^3$ to $10^{18}$ atoms/cm$^3$. In some embodiments, second well 112 has a higher dopant concentration than substrate 104 and epi-layer 108. In some embodiments, a portion of a bottom surface of second well 112 is in electrical contact with buried layer 106.

Deep well 114 is formed in epi-layer 108 and has the first conductivity type. Suitable dopants for deep well 114 include dopants suitable for doping substrate 104 which have the same conductivity type. Deep well 114 is formed between first well 110 and buried layer 106. Deep well 114 extends beneath first well 110 to electrically connect the first and second portions of second well 112, which surround the sides first well 110 by ion implantation. In some embodiments, a dopant concentration of deep well 114 ranges from $10^{15}$ atoms/cm$^3$ to $10^{18}$ atoms/cm$^3$. In some embodiments, deep well 114 has a dopant concentration higher than the dopant concentration of second well 112. In some embodiments, the dopant concentration of deep well 114 is lower than the dopant concentration of second well 112. In some embodiments, the dopant concentration of deep well 114 is the same as the dopant concentration of second well 112. In some embodiments, a bottom surface of deep well 114 is in electrical contact with buried layer 106. In some embodiments, deep well 114 does not extend to a bottom surface of epi-layer 108. In some embodiments, a thickness of deep well 114 ranges from 0.5 µm to 2 µm.

Third well 116 is formed in epi-layer 108 and has the second conductivity type. Suitable dopants for third well 116 include dopants suitable for doping substrate 104 which have the opposite conductivity type. Third well 116 surrounds the sides of second well 112 and deep well 114. Third well 116 is in electrical contact with second well 112 along an entire surface of third well 116 between second well 112 and third well 116. In some embodiments, a dopant concentration of third well 116 ranges from $10^{16}$ atoms/cm$^3$ to $10^{18}$ atoms/cm$^3$. Portions of third well 116 below isolation features 118*a* and 118*d* are in electrical contact with outer portion 108*a* of epi-layer 108. A bottom surface of third well 116 is in electrical contact with buried layer 106.

Contact regions 120*a*-120*g* are formed in epi-layer 108 between an exposed surface of epi-layer 108 and corresponding portions of the first well 110, second well 112, third well 116 and outer portion 108*a* of epi-layer 108. Contact regions 120*a*-120*g* have the same conductivity as the well or epi-layer over which the individual contact region is formed. Suitable dopants for contact regions 120*a*-120*g* include dopants suitable for doping substrate 104 which have the appropriate conductivity type. In some embodiments, a dopant concentration in contact regions 120*a*-120*g* ranges from $10^{19}$ atoms/cm$^3$ to $10^{21}$ atoms/cm$^3$. In some embodiments, all contact regions 120*a*-120*g* have the same dopant concentration. In some embodiments, all contact regions having the same conductivity type have the same dopant concentration. In some embodiments, contact regions 120*a*-120*g* independently have different dopant concentrations.

Contact regions 120*a*-120*g* electrically connect corresponding wells to electrical lines. Contact region 120*a* electrically connects the first portion 108*a* of epi-layer 108 to ground. Contact region 120*b* electrically connects the first portion of third well 116 to anode 130. Contact region 120*b* is separated from contact region 120*a* by isolation feature 118*a*. Contact region 120*c* connects the first portion of second well 112 to anode 130. Contact region 120*c* is in electrical contact with contact region 120*b* along an entire surface between contact region 120*b* and contact region 120*c*. Contact region 120*d* electrically connects first well 110 to cathode 140. Contact region 120*d* is separated from contact region 120*c* by isolation feature 118*b*. Contact region 120e electrically connects the second portion of second well 112 to anode 130. Contact region 120e is separated from contact region 120d by isolation feature 118c. Contact region 120f electrically connects the second portion of third well 116 to anode 130. Contact region 120f is in electrical contact with contact region 120e along an entire surface between contact region 120e and contact region 120f. Contact region 120g electrically connects the second portion 108b of epi-layer 108 to ground. Contact region 120g is separated from contact region 120f by isolation feature 118d.

Transistor N is configured to turn boost converter circuit 100 on and off based on gate signal voltage $V_G$. Gate signal voltage $V_G$ is supplied by a control circuit to activate or deactivate transistor N. When transistor N is activated, current flows between inductor L and capacitor C and through triple well isolated diode 102. When transistor N is deactivated, current does not flow between inductor L and capacitor C or through triple well isolated diode 102. In some embodiments, transistor N is a metal oxide semiconductor (MOS) transistor including either an n-type MOS (NMOS) or a p-type MOS (PMOS) transistor.

Triple well isolated diode 102 is capable of operating in either a forward direction, i.e., current flowing from inductor L to capacitor C, or in a reverse direction, i.e., current flowing from capacitor C to inductor L. When triple well isolated diode 102 is operating in a forward direction, the charge at capacitor C is 0 V. When triple well isolated diode 102 is operating in a reverse direction, the charge at capacitor C equals output voltage Vo.

Triple well isolated diode 102 has anode 130 positioned between a grounded portion of epi-layer 108 and cathode 140. This arrangement reduces the amount of substrate leakage current. In comparison to a conventional double well diode structure, triple well isolated diode 102 has a reduced parasitic bi-polar junction transistor (BJT). The parasitic BJT in a conventional twin well diode has a substrate current leakage of approximately 50%. In contrast, triple well isolated diode 102 exhibits a substrate current leakage significantly less than 1%. The low substrate current leakage of triple well isolated diode 102 reduces power consumption and increases the efficiency of boost converter circuit 100 versus the conventional twin well diode.

Further, the substrate current leakage of conventional twin well diodes increases exponentially above a turn on voltage of about 0.8V. The increase in substrate current leakage hampers the ability of conventional twin well diodes to tolerate power spikes during operation. Triple well isolated diode 102; however, maintains a substrate current leakage significantly less than 1% for turn on voltages up to at least 1.2V. The ability to maintain efficient operation in a wide range of turn on voltages enables the incorporation of triple well isolated diode 102 into circuitry without the need to provide additional circuitry to control the operating voltage. The ability to omit additional circuit to control the operating voltage reduces an area of an integrated circuit design.

Triple well isolated diode 102 also exhibits a high breakdown voltage. The breakdown voltage of triple well isolated diode 102 is greater than 55V. The high breakdown voltage enhances an ability of triple well isolated diode 102 to operate at high voltages resulting in the ability to produce an increased magnitude output voltage Vo.

Figure 2:
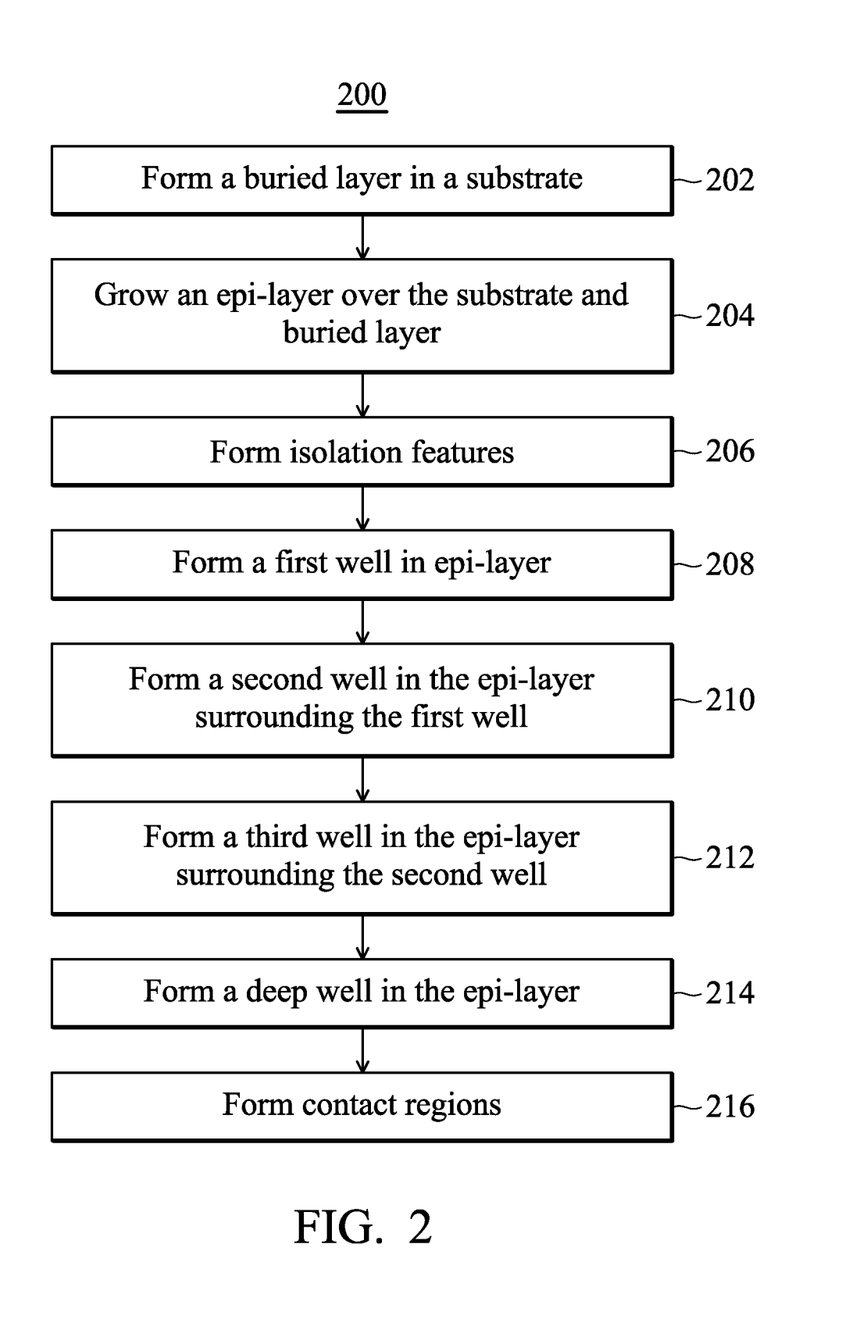
FIG. 2 is a flow chart of a method of making a triple well isolated diode according to one or more embodiments.
Figure 3A:
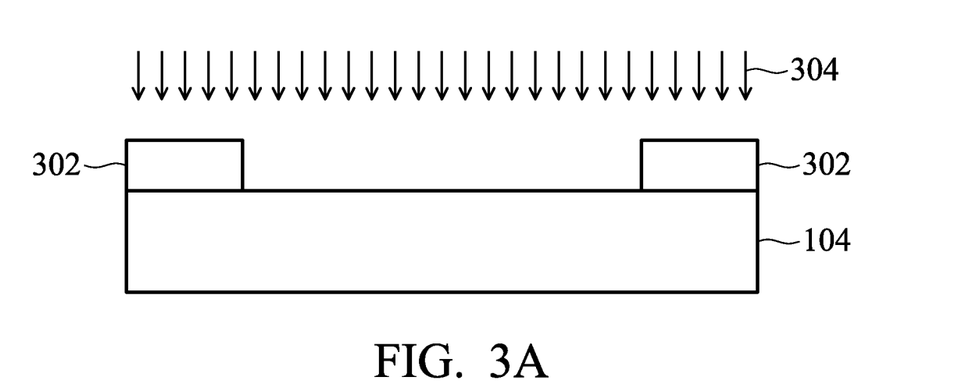
FIGS. 3A-3D are cross-sectional views of the triple well isolated diode at various stages of manufacture according to one or more embodiments.

FIG. 2 is a flow chart of a method 200 of making triple well isolated diode 102. In operation 202, buried layer 106 is formed in substrate 104. FIG. 3A is a cross-sectional diagram of the formation of buried layer 106 in substrate 104. A boundary defining element 302 is placed over substrate 104 to define the boundaries of buried layer 106. In some embodiments, boundary defining element 302 is an implantation mask. In some embodiments, boundary defining element 302 is a patterned photoresist layer.

In some embodiments, where boundary defining element 302 is the patterned photoresist layer, a photoresist layer is deposited over substrate 104 then patterned using a mask and a photolithography process. The patterned photoresist layer is then etched to form boundary defining element 302. In some embodiments, buried layer 106 is formed using an implantation process 304 to introduce dopants into a surface of substrate 104. Following implantation process 304, boundary defining element 302 is removed.

In some embodiments where boundary defining element 302 is the patterned photoresist layer, boundary defining element 302 is removed using plasma etching or ashing. Following the removal of boundary defining element 302, the surface of substrate 104 remains substantially flat.

In operation 204, epi-layer 108 is grown over substrate 104 and buried layer 106. Epi-layer 108 is grown using an epitaxial growth process. In some embodiments, epi-layer 108 is doped with a p-type dopant. In some embodiments, epi-layer 108 is doped by an ion implantation process. In some embodiments, epi-layer 108 is doped by including impurities in the epitaxial growth process.

Figure 3B:
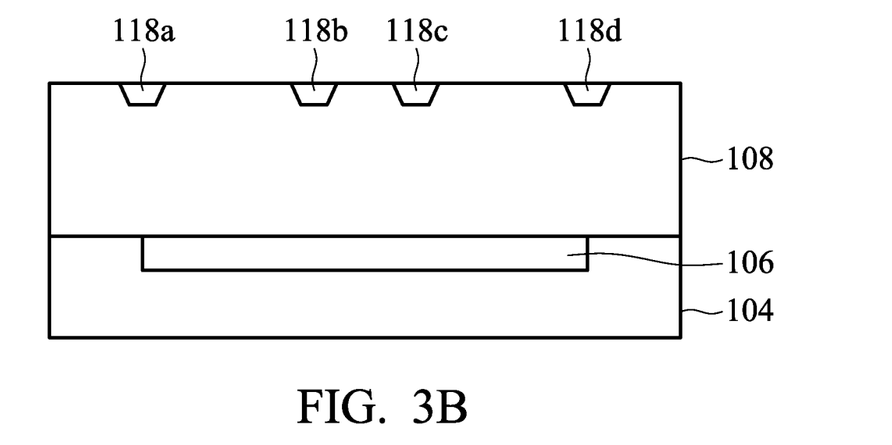

In operation 206, isolation features 118a-118d are formed in epi-layer 108. In some embodiments, isolation features 118a-118d are STI or LOCOS features and are formed using conventional processes. FIG. 3B is a cross-sectional diagram of epi-layer 108 formed over substrate 104 and buried layer 106 and having isolation features 118a-118d formed therein.

In operation 208, first well 110 is formed in epi-layer 108. In some embodiments, first well 110 is formed in epi-layer 108 using an implantation process. In some embodiments, first well 110 is formed in epi-layer 108 using an implantation mask. In some embodiments, first well 110 is formed in epi-layer 108 using a photoresist layer. In some embodiments, first well 110 is formed in epi-layer 108 by the same process used to form buried layer 106 in substrate 104. In some embodiments, first well 110 is formed in epi-layer by a different process than that used to form buried layer 106 in substrate 104. In some embodiments, first well 110 is formed in epi-layer 108 extending all the way to buried layer 106. In some embodiments, first well 110 is formed in epi-layer 108 stopping a certain distance above buried layer 106.

In operation 210, second well 112 is formed in epi-layer 108. Second well 112 is formed to a depth sufficient to electrically connect to buried layer 106. In some embodiments, second well 112 is formed in epi-layer 108 using an implantation process. In some embodiments, second well 112 has a same dopant concentration as epi-layer 108. In some embodiments, second well 112 is formed in epi-layer 108 using an implantation mask. In some embodiments, second well 112 is formed in epi-layer 108 using a photoresist layer. In some embodiments, second well 112 is formed in epi-layer 108 by the same process used to form first well 110 and buried layer 106. In some embodiments, second well 112 is formed in epi-layer 108 by a different process than that used to form at least one of first well 110 and buried layer 106.

Figure 3C:
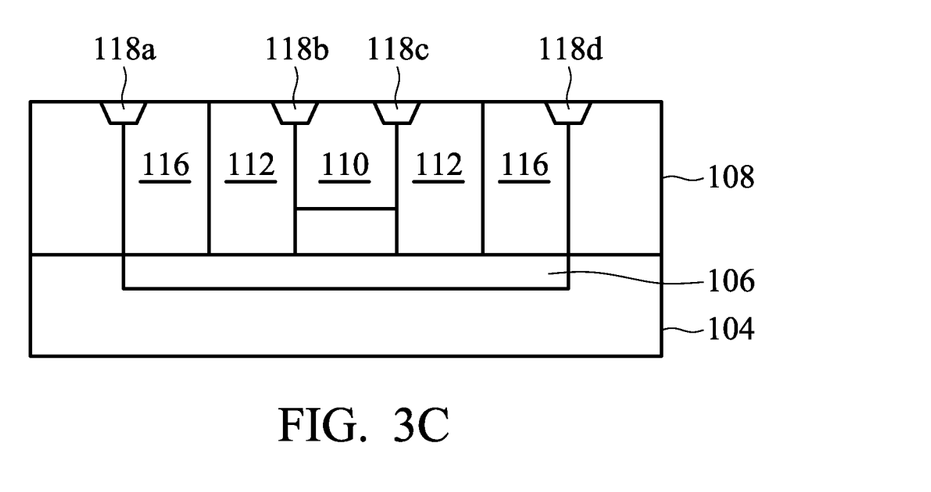

In operation 212, third well 116 is formed in epi-layer 108. Third well 116 is formed to a depth sufficient to electrically connect to buried layer 106. Third well 116 is formed to be in electrical contact with second well 112 along the entire surface of third well 116 between second well 112 and third well 114. In some embodiments, third well 116 is formed in epi-layer 108 using an implantation process. In some embodiments, third well 116 is formed in epi-layer 108 using an implantation mask. In some embodiments, third well 116 is formed in epi-layer 108 using a photoresist layer. In some embodiments, third well 116 is formed in epi-layer 108 by the same process used to form second well 112, first well 110 and buried layer 106. In some embodiments, third well 116 is formed in epi-layer 108 by a different process than that used to form at least one of second well 112, first well 110 or buried layer 106. FIG. 3C is a cross-sectional diagram following the formation of first well 110, second well 112 and third well 116 in epi-layer 108.

Figure 3D:
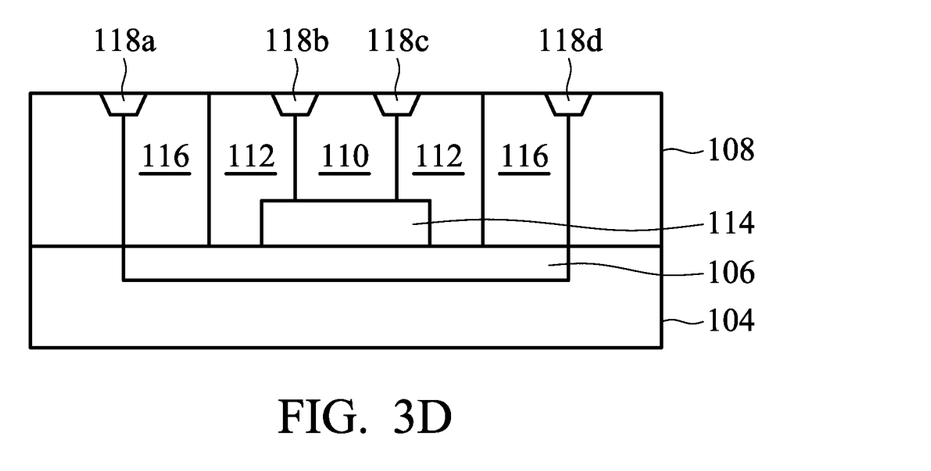

In operation 214, deep well 114 is formed in epi-layer 108. Deep well 114 is formed below first well 110 and in electrical contact with buried layer 106. Deep well 114 is formed to electrically connect to second well 112 on both sides of first well 110. In some embodiments, deep well 114 is formed in epi-layer 108 using an implantation process. In some embodiments, an implantation energy used to form deep well 114 is about 1 MeV. Deep well 114 is formed using higher implantation energy than first well 110 to locate dopants at a greater depth than first well 110. In some embodiments, deep well 114 is formed in epi-layer 108 using an implantation mask. In some embodiments, deep well 114 is formed in epi-layer 108 using a photoresist layer. In some embodiments, deep well 114 is formed in epi-layer 108 by the same process used to form third well 116, second well 112, first well 110 or buried layer 106. In some embodiments, deep well 114 is formed in epi-layer 108 by a different process than that used to form at least one of third well 116, second well 112, first well 110 or buried layer 106. FIG. 3D is a cross-sectional diagram following formation of deep well 114 in epi-layer 108. In some embodiments, deep well 114 is formed prior to first well 110 or second well 112.

In operation 216, contact regions 120a-120g are formed in epi-layer 108. Contact regions 120a-120g are formed to electrically connect to underlying wells. Contact regions 120b and 120c are formed in electrical contact with one another. Contact regions 120e and 120f are formed in electrical contact with one another. In some embodiments, contact regions 120a-120g are formed in epi-layer 108 using an implantation process. In some embodiments, contact regions 120a-120g are formed in epi-layer 108 using an implantation mask. In some embodiments, contact regions 120a-120g are formed in epi-layer 108 using a photoresist layer. In some embodiments, contact regions 120a-120g are formed in epi-layer 108 by the same process used to form deep well 114, third well 116, second well 112, first well 110 or buried layer 106. In some embodiments, contact regions 120a-120g are formed in epi-layer 108 by a different process than that used to form at least one of deep well 114, third well 116, second well 112, first well 110 or buried layer 106. FIG. 1 includes a side view diagram of a triple well isolated diode 102 following formation of contact regions 120a-120g.

One aspect of this description relates to a triple well isolated diode including a substrate having a first conductivity type. The triple well isolated diode further includes a buried layer in the substrate, wherein the buried layer has a second conductivity type opposite to the first conductivity type. The triple well isolated diode further includes an epi-layer over the substrate and the buried layer, wherein a portion of the epi-layer having the first conductivity type is in contact with the buried layer. The triple well isolated diode further includes a first well in the epi-layer, wherein the first well has the second conductivity type. The triple well isolated diode further includes a second well in the epi-layer and surrounding sides of the first well, wherein the second well has the first conductivity type. The triple well isolated diode further includes a third well formed in the epi-layer and surrounding sides of the second well, wherein the third well has the second conductivity type. The triple well isolated diode further includes a deep well in the epi-layer extending beneath the first well to electrically connect to the second well on opposite sides of the first well, wherein the deep well has the first conductivity type.

Another aspect of this description relates to a method of making a triple well isolated diode. The method includes forming a buried layer in a substrate, wherein the buried layer has a second conductivity type and the substrate has a first conductivity type opposite to the second conductivity type. The method further includes forming an epi-layer over the substrate and the buried layer, wherein the epi-layer has the first conductivity type. The method further includes forming a first well in the epi-layer, wherein the first well has the second conductivity type, wherein the first well forms an interface with the buried layer. The method further includes forming a second well in the epi-layer, wherein the second well has the first conductivity type and surrounds the first well. The method further includes forming a third well in the epi-layer, wherein the third well has the second conductivity type and surrounds the second well, and a surface of the third well closest to the substrate is coplanar with a surface of the second well closest to the substrate. The method further includes forming a deep well in the epi-layer, wherein the deep well has the first conductivity type and extends beneath the first well to electrically connect to the second well on both sides of the first well.

Still another aspect of this description relates to a semiconductor device including a substrate having a first conductivity type. The semiconductor device further includes a buried layer in the substrate, wherein the buried layer has a second conductivity type opposite to the first conductivity type. The semiconductor device further includes an epi-layer over the substrate and contacting the buried layer, wherein the epi-layer has the first conductivity type. The semiconductor device further includes a first well in the epi-layer, wherein the first well has the second conductivity type. The semiconductor device further includes a second well in the epi-layer and surrounding sides of the first well, wherein the second well has the first conductivity type, and a portion of the second well forms an interface with the buried layer. The semiconductor device further includes a third well formed in the epi-layer and surrounding sides of the second well, wherein the third well has the second conductivity type. The semiconductor device further includes a deep well in the epi-layer extending beneath the first well to electrically connect to the second well on opposite sides of the first well, wherein the deep well has the first conductivity type.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A triple well isolated diode comprising:
a substrate having a first conductivity type;
a buried layer in the substrate, wherein the buried layer has a second conductivity type opposite to the first conductivity type, and a top surface of the buried layer is coplanar with a top surface of the substrate;

an epi-layer over the substrate and the buried layer, wherein a portion of the epi-layer having the first conductivity type is in contact with the buried layer;

a first well in the epi-layer, wherein the first well has the second conductivity type;

a second well in the epi-layer and surrounding sides of the first well, wherein the second well has the first conductivity type;

a third well formed in the epi-layer and surrounding sides of the second well, wherein the third well has the second conductivity type;

a deep well in the epi-layer extending beneath the first well to electrically connect to the second well on opposite sides of the first well, wherein the deep well has the first conductivity type, and a dopant concentration of the deep well is different from a dopant concentration of the second well;

a first plurality of isolation features formed between the first well and the second well; and a second plurality of isolation features formed between the third well and the epi-layer.

2. The triple well isolated diode of claim 1, further comprising:

a first contact region electrically connected to the epi-layer in an area of the epi-layer surrounding sides of the third well, wherein the first contact region has the first conductivity type; and a second contact region electrically connected to the epi-layer in the area of the epi-layer surrounding sides of the third well, wherein the second contact region has the first conductivity type, and the first contact region and the second contact region are configured to electrically connect the epi-layer to a ground voltage.

3. The triple well isolated diode of claim 2, further comprising: a third contact region, wherein the third contact region has the second conductivity type, and the third contact region is configured to electrically connect the first well to an output voltage.

4. The triple well isolated diode of claim 3, further comprising:

a fourth contact region electrically connected to the third well, wherein the fourth contact region has the second conductivity type;

a fifth contact region electrically connected to the third well, wherein the fifth contact region has the second conductivity type, and the fourth contact region and the fifth contact region are configured to electrically connect the third well to an input voltage;

a sixth contact region electrically connected to the second well, wherein the sixth contact region has the first conductivity type; and a seventh contact region electrically connected to the second well, wherein the seventh contact region has the first conductivity type, and the sixth contact region and the seventh contact region are configured to electrically connect the second well to the input voltage.

5. The triple well isolated diode of claim 1, wherein the second well is configured to electrically connect to the third well along an entire outside surface of the second well.

6. The triple well isolated diode of claim 1, wherein the buried layer extends underneath the second well and is configured to electrically connect to the third well on both sides of the second well.

7. The triple well isolated diode of claim 1, wherein the first well, the second well and the third well are configured to have a substrate current leakage less than 1%.

8. The triple well isolated diode of claim 1, wherein the first conductivity type is a p-type conductivity.

9. A semiconductor device comprising:

a substrate having a first conductivity type;

a buried layer in the substrate, wherein the buried layer has a second conductivity type opposite to the first conductivity type;

an epi-layer over the substrate and the buried layer, wherein the epi-layer has the first conductivity type;

a first well in the epi-layer, wherein the first well has the second conductivity type;

a second well in the epi-layer and surrounding sides of the first well, wherein the second well has the first conductivity type, and a portion of the second well forms an interface with the buried layer;

a third well formed in the epi-layer and surrounding sides of the second well, wherein the third well has the second conductivity type;

a first contact region electrically connected to the epi-layer in an area of the epi-layer surrounding sides of the third well, wherein the first contact region has the first conductivity type; and a deep well in the epi-layer extending beneath the first well to electrically connect to the second well on opposite sides of the first well, wherein the deep well has the first conductivity type.

10. The semiconductor device of claim 9, further comprising:

a second contact region electrically connected to the epi-layer in the area of the epi-layer surrounding sides of the third well, wherein the second contact region has the first conductivity type, and the first contact region and the second contact region are configured to electrically connect the epi-layer to a ground voltage.

11. The semiconductor device of claim 10, further comprising: a third contact region, wherein the third contact region has the second conductivity type, and the third contact region is configured to electrically connect the first well to an output voltage.

12. The semiconductor device of claim 11, further comprising:

a fourth contact region electrically connected to the third well, wherein the fourth contact region has the second conductivity type;

a fifth contact region electrically connected to the third well, wherein the fifth contact region has the second conductivity type, and the fourth contact region and the fifth contact region are configured to electrically connect the third well to an input voltage;

a sixth contact region electrically connected to the second well, wherein the sixth contact region has the first conductivity type; and a seventh contact region electrically connected to the second well, wherein the seventh contact region has the first conductivity type, and the sixth contact region and the seventh contact region are configured to electrically connect the second well to the input voltage.

13. The semiconductor device of claim 9, further comprising:

a first isolation feature formed between the first well and the second well; and a second isolation feature formed between the third well and the epi-layer.

14. The semiconductor device of claim 9, wherein the second well is configured to electrically connect to the third well along an outside surface of the second well.

15. The semiconductor device of claim 9, wherein the buried layer extends underneath the second well and is configured to electrically connect to the third well on both sides of the second well.

16. The semiconductor device of claim 9, wherein the first well forms an interface with the deep well.

17. A triple well isolated diode comprising:
   a substrate having a first conductivity type;
   a buried layer in the substrate, wherein the buried layer has a second conductivity type opposite to the first conductivity type, and a top surface of the buried layer is coplanar with a top surface of the substrate;
   an epi-layer over the substrate and the buried layer, wherein a portion of the epi-layer having the first conductivity type is in contact with the buried layer, wherein a bottom surface of the epi-layer is above a top surface of the buried layer;
   a first well in the epi-layer, wherein the first well has the second conductivity type;
   a second well in the epi-layer and surrounding sides of the first well, wherein the second well has the first conductivity type, and a portion of the second well forms an interface with the buried layer;
   a third well formed in the epi-layer and surrounding sides of the second well, wherein the third well has the second conductivity type; and
   a deep well in the epi-layer extending beneath the first well to electrically connect to the second well on opposite sides of the first well, wherein the deep well has the first conductivity type, and a dopant concentration of the deep well is different from a dopant concentration of the second well.

18. The semiconductor device of claim 17, further comprising:
   a first isolation feature between the first well and the second well; and
   a second isolation feature between the third well and the epi-layer.

19. The triple well isolated diode of claim 18, further comprising:
   a first plurality of isolation features between the first well and the second well, the first isolation feature is one of the first plurality of isolation features; and
   a second plurality of isolation features between the third well and the epi-layer, the second isolation feature is one of the second plurality of isolation features.

20. The triple well isolated diode of claim 17, wherein a region of the second well adjacent to the third well has a first depth, and a region of the second well adjacent to the first well has a second depth less than the first depth.

\* \* \* \* \*